US012282067B2

(12) United States Patent
Chiu

(10) Patent No.: US 12,282,067 B2
(45) Date of Patent: Apr. 22, 2025

(54) CALCULATION METHOD AND DETECTION DEVICE FOR BATTERY POWER

(71) Applicant: Wistron Corporation, New Taipei (TW)

(72) Inventor: Chih-Hao Chiu, New Taipei (TW)

(73) Assignee: Wistron Corporation, New Taipei (TW)

( * ) Notice: Subject to any disclaimer, the term of this patent is extended or adjusted under 35 U.S.C. 154(b) by 155 days.

(21) Appl. No.: 18/186,964

(22) Filed: Mar. 21, 2023

(65) Prior Publication Data

US 2024/0272229 A1    Aug. 15, 2024

(30) Foreign Application Priority Data

Jan. 30, 2023   (TW) .................................. 112102965

(51) Int. Cl.
*G01R 31/3835* (2019.01)
*G01R 31/392* (2019.01)
*H02J 7/00* (2006.01)

(52) U.S. Cl.
CPC ....... *G01R 31/3835* (2019.01); *G01R 31/392* (2019.01); *H02J 7/005* (2020.01)

(58) Field of Classification Search
CPC .. G01R 31/3835; G01R 31/392; G01R 31/36; G01R 31/367; H02J 7/005; Y02E 60/10
See application file for complete search history.

(56) References Cited

U.S. PATENT DOCUMENTS

| | | | |
|---|---|---|---|
| 2012/0228939 A1* | 9/2012 | Kaga .......................... | H02J 7/35 307/43 |
| 2013/0187657 A1* | 7/2013 | Yen ......................... | H01M 10/44 324/427 |
| 2018/0292465 A1* | 10/2018 | Osara .................. | G01N 33/2888 |
| 2019/0069246 A1* | 2/2019 | Pintado ............. | H04W 52/0261 |
| 2022/0075001 A1* | 3/2022 | Suzuki .................. | H02J 7/0068 |

* cited by examiner

Primary Examiner — Akm Zakaria
(74) Attorney, Agent, or Firm — JCIPRNET

(57) ABSTRACT

A calculation method and a detection device for detecting a power capacity of a battery of an electronic device are provided. In the calculation method, a highest voltage value and a lowest voltage value of the battery are received. A unit voltage difference value is generated according to the highest voltage value and the lowest voltage value. A voltage value of the battery is converted into voltage value data, and the electronic device is controlled in an operation mode to obtain a time length required for the voltage value data to drop to the unit voltage difference value in the operation mode. A total discharge capacity of the battery is generated according to the time length and a use time interval of the electronic device in the operation mode, and a current power capacity is generated according to the total discharge capacity.

19 Claims, 7 Drawing Sheets

CALCULATION METHOD AND DETECTION DEVICE FOR BATTERY POWER

CROSS-REFERENCE TO RELATED APPLICATION

This application claims the priority benefit of Taiwan application serial no. 112102965, filed on Jan. 30, 2023. The entirety of the above-mentioned patent application is hereby incorporated by reference herein and made a part of this specification.

BACKGROUND

Technical Field

The disclosure relates to a calculation method and a detection device, and more particularly, to a calculation method and a detection device for detecting a current power capacity of a battery of an electronic device.

Description of Related Art

Generally speaking, an electronic device with a battery has a function of detecting a current power capacity of the battery. The electronic device uses a battery voltage of the battery to calculate the current power capacity of the battery.

However, the battery voltage is a floating value. During the use of the electronic device, the battery discharges. The current power capacity of the battery often has an illusion of backtracking of the power capacity due to fluctuation of the battery voltage. For example, during a discharge process of the battery, the battery voltage rises briefly based on different loads or transitions of different operation modes of the electronic device. As a result, the current power capacity of the battery is displayed sequentially as 89.1%, 88.9%, 89.1%, and 89.0%, for example. During the discharge process of the battery, an increase in the current power capacity from 88.9% to 89.1% is obviously contradictory to a decline in the actual power capacity. Therefore, how to eliminate the illusion of the backtracking of the power capacity is one of the research focuses for those skilled in the art.

SUMMARY

The disclosure provides a calculation method and a detection device for detecting a current power capacity of a battery of an electronic device, which may eliminate an illusion of backtracking of the current power capacity of the battery.

A calculation method in an embodiment of the disclosure is used to detect a current power capacity of a battery of an electronic device. The calculation method includes the following. A highest voltage value and a lowest voltage value of the battery are received. A unit voltage difference value is generated according to the highest voltage value and the lowest voltage value. A voltage value of the battery is converted into voltage value data, and the electronic device is controlled in at least one operation mode to obtain at least one time length required for the voltage value data to drop to the unit voltage difference value in the at least one operation mode. A total discharge capacity of the battery is generated according to the at least one time length and at least one use time interval of the electronic device in the at least one operation mode. The current power capacity is generated according to the total discharge capacity.

A detection device in an embodiment of the disclosure is used to detect a current power capacity of a battery of an electronic device. The detection device includes a converter and a calculation circuit. The converter is coupled to the battery. The converter converts a voltage value of the battery into voltage value data. The calculation circuit is coupled to the converter. The calculation circuit receives a highest voltage value and a lowest voltage value of the battery, and generate a unit voltage difference value according to the highest voltage value and the lowest voltage value. The calculation circuit controls the electronic device in at least one operation mode to obtain at least one time length required for the voltage value data to drop to the unit voltage difference value in the at least one operation mode, and generates a total discharge capacity of the battery according to the at least one time length and at least one use time interval of the electronic device in the at least one operation mode. In addition, the calculation circuit generates the current power capacity according to the total discharge capacity.

Based on the above, in the calculation method and the detection device of the disclosure, the electronic device is controlled in the operation mode to obtain the time length required for the voltage value data to drop to the unit voltage difference value in the operation mode, generate the total discharge capacity of the battery according to the time length and the use time interval of the electronic device in the operation mode, and generate the current power capacity according to the total discharge capacity. It should be noted that in the calculation method and the detection device, the current power capacity is determined based on the use time interval of the electronic device in the operation mode, rather than directly based on the battery voltage of the battery to determine the current power capacity. Therefore, the calculation method and the detection device of the disclosure nay eliminate the illusion of the backtracking of the power capacity.

In order for the aforementioned features and advantages of the disclosure to be more comprehensible, embodiments accompanied with drawings are described in detail below.

DETAILED DESCRIPTION OF DISCLOSED EMBODIMENTS

Figure 1:
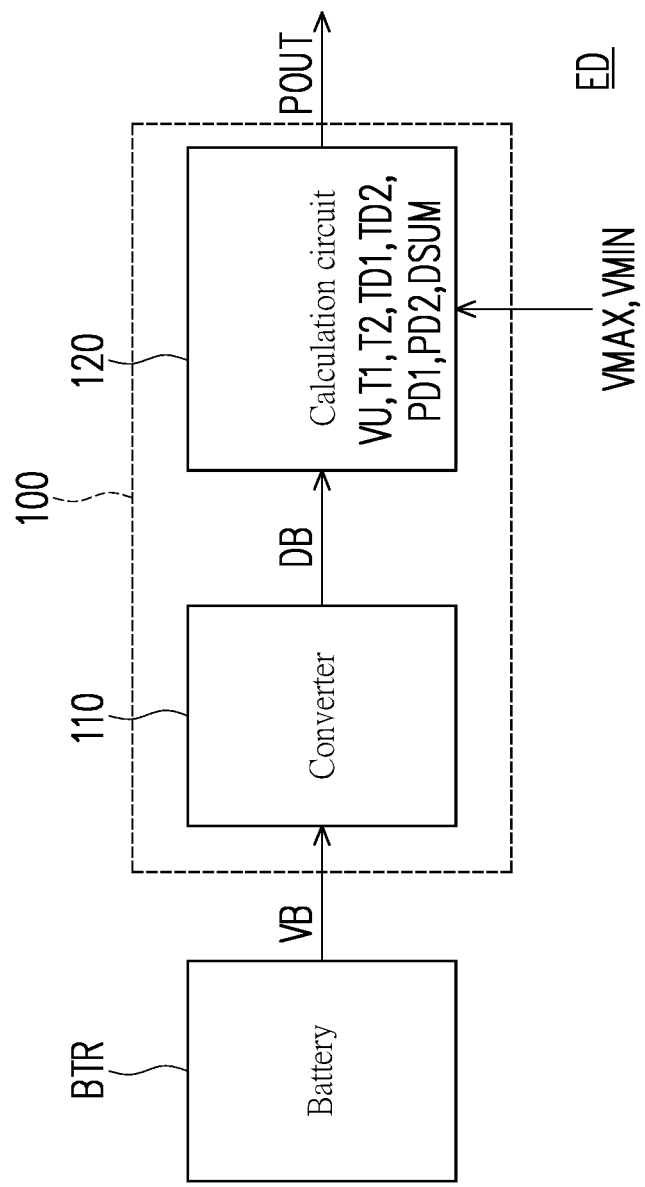
FIG. 1 is a schematic view of an electronic device according to an embodiment of the disclosure.

Some embodiments of the disclosure will be described in detail with reference to the accompanying drawings. For reference numerals cited in the following descriptions, the same reference numerals appearing in different drawings are regarded as the same or similar components. The embodiments are only a part of the disclosure and do not disclose all possible implementations of the disclosure. More precisely, the embodiments are merely examples of the device and the method.

Figure 2:
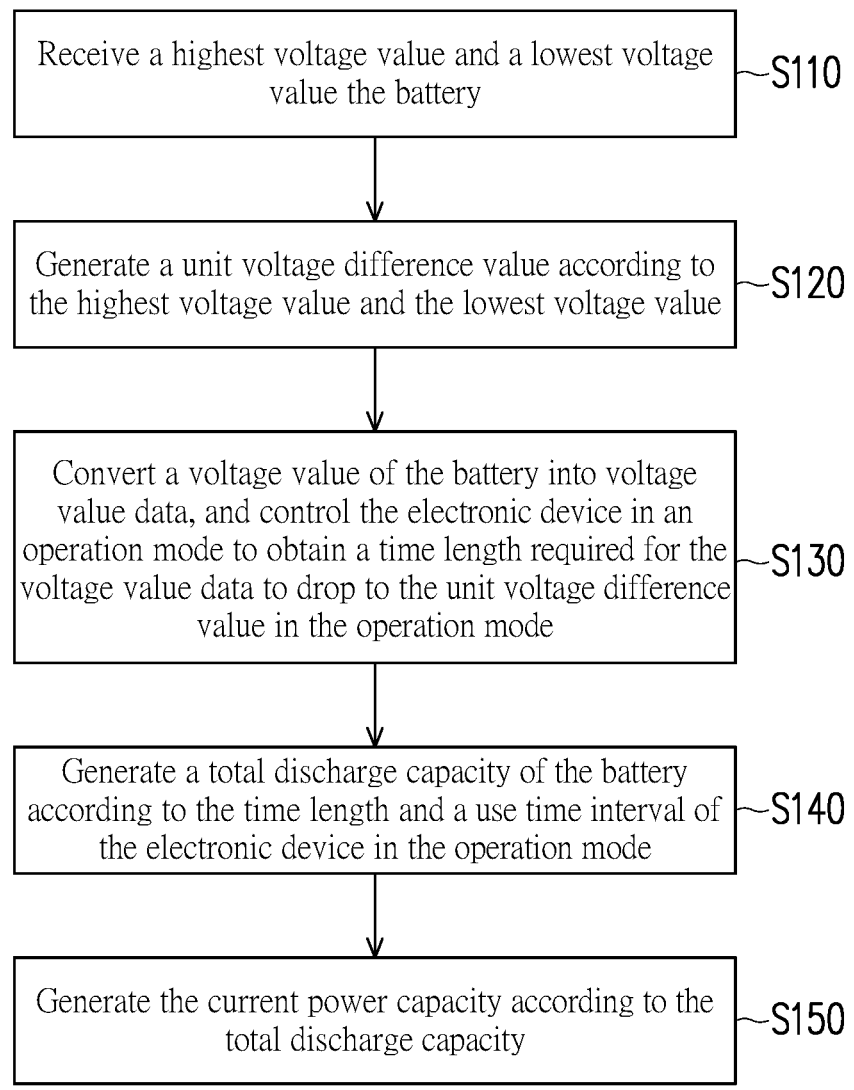
FIG. 2 is a flowchart of a calculation method according to an embodiment of the disclosure.

Referring to FIGS. 1 and 2, FIG. 1 is a schematic view of an electronic device according to an embodiment of the disclosure. FIG. 2 is a flowchart of a calculation method according to an embodiment of the disclosure. In an embodiment, an electronic device ED at least includes a battery BTR and a detection device 100. The detection device 100 includes a converter 110 and a calculation circuit 120. The converter 110 is coupled to the battery BTR. The converter 110 receives a voltage value VB from the battery BTR. The converter 110 converts the voltage value VB of the battery BTR into voltage value data DB. In an embodiment, the voltage value VB of the battery BTR is an analog voltage signal. The voltage value data DB is a digital signal. Therefore, the converter 110 may be implemented by an analog-to-digital converter (ADC).

In an embodiment, the calculation circuit 120 is coupled to the converter 110. The calculation circuit 120 generates a current power capacity POUT of the battery BTR. In an embodiment, the calculation circuit 120 is, for example, a central processing unit (CPU), other programmable general purpose or special purpose microprocessors, a digital signal processor (DSP), a programmable controller, an application specific integrated circuit (ASIC), a programmable logic device (PLD), other similar devices, or a combination of these devices, which may load and execute computer programs.

In an embodiment, a calculation method S100 is applicable to the detection device 100. The calculation method S100 includes steps S110 to S150. In step S110, the calculation circuit 120 receives a highest voltage value VMAX of the battery BTR and a lowest voltage value VMIN of the battery BTR. In an embodiment, the highest voltage value VMAX of the battery BTR and the lowest voltage value VMIN of the battery BTR may be known based on a specification of the battery BTR or a charge and discharge test of the battery BTR. The highest voltage value VMAX of the battery BTR and the lowest voltage value VMIN of the battery BTR may be input to the calculation circuit 120.

In step S120, the calculation circuit 120 generates a unit voltage difference value VU according to the highest voltage value VMAX of the battery BTR and the lowest voltage value VMIN of the battery BTR. In an embodiment, the calculation circuit 120 subtracts the lowest voltage value VMIN from the highest voltage value VMAX to generate a voltage difference value, and divides the voltage difference value by a preset unit value to generate the unit voltage difference value VU. In an embodiment, the preset unit value is, for example, "100", but the disclosure is not limited thereto. In other words, the unit voltage difference value VU is one hundredth of a difference value between the highest voltage value VMAX and the lowest voltage value VMIN. The calculation circuit 120 obtains the unit voltage difference value VU based on the formula (1).

$$VU = \frac{VMAX - VMIN}{100} \quad \ldots \quad \text{Formula (1)}$$

For example, the highest voltage value VMAX is, for example, 3300 millivolts (mV). The lowest voltage value VMIN is, for example, 1800 mV, and the disclosure is not limited thereto. Therefore, the unit voltage difference value VU is equal to 15 mV. In this embodiment, when the voltage value data DB drops by 15 mV, the current power capacity POUT drops substantially by 1%.

In addition, the calculation circuit 120 performs an average calculation on the voltage value data based on a sampling time length. For example, the converter 110 samples the voltage value data DB to the calculation circuit 120 every 1 second. The sampling time length is 10 seconds, and the disclosure is not limited thereto. Therefore, the calculation circuit 120 collects raw data and performs the average calculation on the raw data to generate a sampling average value of the voltage value data DB. Therefore, through the calculation of the sampling average value of the voltage value data DB, probability of occurrence of an illusion of backtracking of the power capacity may be reduced.

In step S130, the calculation circuit 120 controls the electronic device ED in at least one operation mode to obtain at least one time length required for the voltage value data DB to drop to the unit voltage difference value VU in the at least one operation mode.

Taking this embodiment as an example, the at least one operation mode includes a first operation mode and a second operation mode. The electronic device ED may operate in the first operation mode and the second operation mode. The disclosure is not limited to the number of operation modes. In step S130, the calculation circuit 120 controls the electronic device ED in the first operation mode to obtain a time length T1 required for the voltage value data DB to drop to the unit voltage difference value VU in the first operation mode. The calculation circuit 120 controls the electronic device ED in the second operation mode to obtain a time length T2 required for the voltage value data DB to drop to the unit voltage difference value VU in the second operation mode.

For example, taking the electronic device ED as a motion capture device as an example (the disclosure is not limited to types of the electronic device ED), when the electronic device ED is, for example, in a state of Bluetooth disconnection, the electronic device ED operates in the first operation mode. When the electronic device ED is, for example, in a state of Bluetooth connection, the electronic device ED operates in the second operation mode. In the first operation mode, the electronic device ED is required to continuously broadcast Bluetooth data. Power consumption of the first operation mode is greater than power consumption of the second operation mode. In the first operation mode, the time length T1 required for the voltage value data DB to drop to the unit voltage difference value VU (e.g., 15 mV) is 10 minutes (i.e., 600 seconds). In the second operation mode, the time length T2 required for the voltage value data DB to drop to the unit voltage difference value VU is 15 minutes (i.e., 900 seconds). In other words, the current power capacity POUT decreases by 1% every 10 minutes in the first operation mode, and decreases by 1% every 15 minutes in the second operation mode. In the first operation mode, a decrement ratio of the current power capacity POUT per second is shown in the formula (2). In the second operation mode, the decrement ratio of the current power capacity POUT per second is shown in the formula (3).

$$p1 = \frac{1}{600} = 0.0016666 \ldots \quad \text{Formula (2)}$$

$$p2 = \frac{1}{900} = 0.0011111 \ldots \quad \text{Formula (3)}$$

In step S140, the calculation circuit 120 generates a total discharge capacity DSUM of the battery BTR according to the at least one time length corresponding to the at least one operation mode and at least one use time interval of the electronic device ED in the at least one operation mode.

In the above example, the at least one operation mode includes the first operation mode and the second operation mode. The calculation circuit 120 generates a first discharge capacity PD1 of the battery BTR according to the time length T1 and a use time interval TD1 of the electronic device ED in the first operation mode. The calculation circuit 120 generates a second discharge capacity PD2 of the battery BTR according to the time length T2 and a use time interval TD2 of the electronic device ED in the second operation mode. The first discharge capacity PD1 is shown in the formula (4). The second discharge capacity PD2 is shown in the formula (5).

$$PD1 = TD1 \times p1 = \frac{TD1}{600} \ldots \quad \text{Formula (4)}$$

$$PD2 = TD2 \times p2 = \frac{TD2}{900} \ldots \quad \text{Formula (5)}$$

In other words, the calculation circuit 120 divides the use time interval TD1 by the time length T1 to obtain the first discharge capacity PD1. The calculation circuit 120 divides the use time interval TD2 by the time length T2 to obtain the second discharge capacity PD2. The calculation circuit 120 sums the first discharge capacity PD1 and the second discharge capacity PD2 to generate the total discharge capacity DSUM. The total discharge capacity DSUM may be obtained by the following formula (6).

$$DSUM = \Sigma_{i=0}^{n} TD(i) \times p(i) \ldots \quad \text{Formula (6)}$$

For example, an operation time length of the electronic device ED in the use time interval TD1 of the first operation mode is 6 seconds. The operation time length of the electronic device ED in the use time interval TD2 of the second operation mode is 4 seconds. Therefore, the first discharge capacity PD1 is 0.0099996%. The second discharge capacity PD2 is 0.0044444%. Therefore, the total discharge capacity DSUM is 0.014444%.

In step S150, the calculation circuit 120 generates the current power capacity POUT according to the total discharge capacity DSUM. Specifically, the calculation circuit 120 subtracts the total discharge capacity DSUM from a previous power capacity to generate the current power capacity POUT. The calculation circuit 120 may obtain the current power capacity POUT based on the formula (7).

$$POUT = PPRE - DSUM = PPRE - \Sigma_{i=0}^{n} TD(i) \times p(i) \ldots \quad \text{Formula (7)}$$

PPRE is the previous power capacity. For example, the total discharge capacity DSUM is 0.014444%. The previous power capacity is 90%. Therefore, after the use time intervals TD1 and TD2, the current power capacity POUT is 89.985556%.

It is worth mentioning here that the detection device 100 obtains the time lengths T1 and T2 required for the voltage value data DB to drop to the unit voltage difference value VU in the first operation mode and the second operation mode, and generates the total discharge capacity DSUM of the battery BTR according to the time lengths T1 and T2 and the use time intervals TD1 and TD2 of the electronic device in the operation mode. The detection device 100 generates the current power capacity POUT according to the total discharge capacity DSUM. It should be noted that the detection device 100 determines the current power capacity POUT according to the at least one use time interval of the electronic device ED in the at least one operation mode, rather than directly determining the current power capacity POUT of the battery BTR according to the voltage value VB of the battery BTR. Therefore, the detection device 100 may eliminate the illusion of the backtracking of the power capacity.

It should be understood that during a charge process of the battery BTR, the voltage value data DB rises to the unit voltage difference value VU, and the current power capacity POUT increases by 1%.

Figure 3:
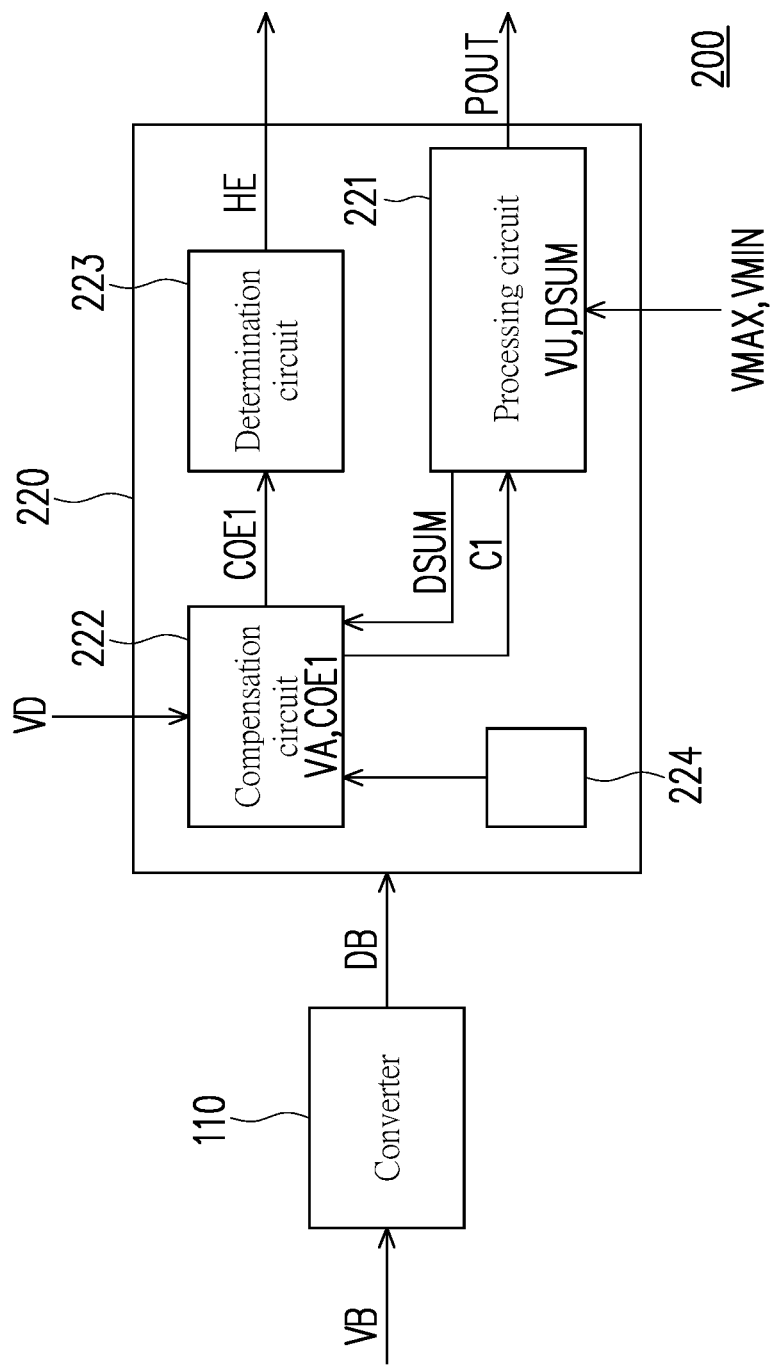
FIG. 3 is a schematic view of a detection device according to an embodiment of the disclosure.

Referring to FIG. 3, FIG. 3 is a schematic view of a detection device according to an embodiment of the disclosure. In an embodiment, a detection device 200 includes the converter 110 and a calculation circuit 220. The converter 110 converts the voltage value VB of a battery (such as the battery BTR of the electronic device ED shown in FIG. 1) into the voltage value data DB. The calculation circuit 220 includes a processing circuit 221, a compensation circuit 222, and a determination circuit 223. In an embodiment, the processing circuit 221 generates the total discharge capacity DSUM. Implementation details of the processing circuit 221 generating the total discharge capacity DSUM are substantially similar to implementation details of the calculation circuit 120 in FIG. 1 generating the total discharge capacity DSUM. Therefore, the same details will not be repeated in the following.

In an embodiment, the compensation circuit 222 is coupled to the processing circuit 221. The compensation circuit 222 generates a discharge compensation coefficient COE1 of the battery, and generates a discharge compensation value C1 according to the discharge compensation coefficient COE1. The processing circuit 221 compensates the current power capacity POUT according to the discharge compensation value C1.

The determination circuit 223 is coupled to the compensation circuit 222. The determination circuit 223 determines a state of health HE of the battery according to the discharge compensation coefficient COE1.

Figure 4:
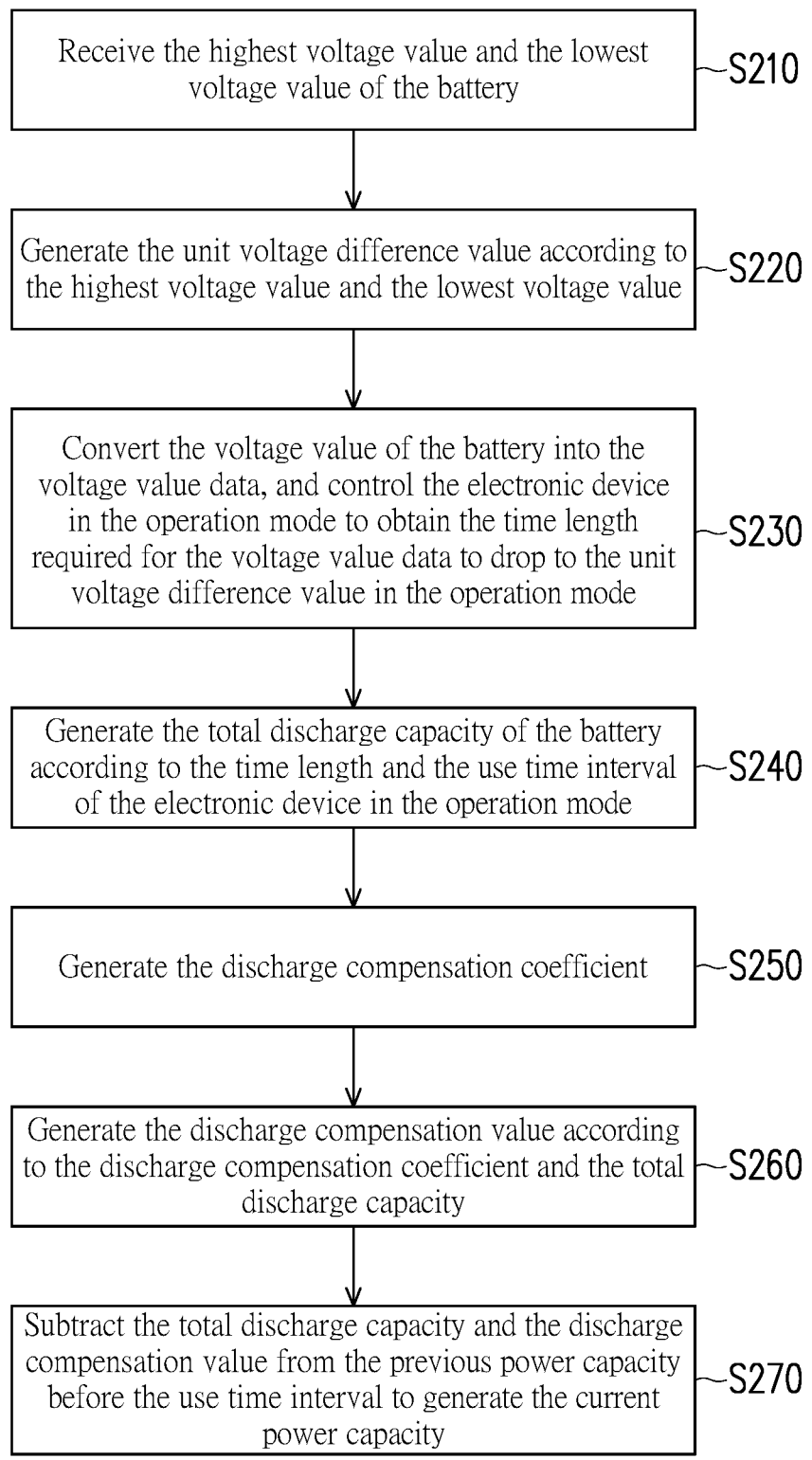
FIG. 4 is a flowchart of a calculation method according to an embodiment of the disclosure.

Referring to both FIGS. 3 and 4, FIG. 4 is a flowchart of a calculation method according to an embodiment of the disclosure. In an embodiment, a calculation method S200 is applicable to the detection device 200. The calculation method S200 includes steps S210 to S270. In step S210, the processing circuit 221 receives the highest voltage value VMAX and the lowest voltage value VMIN of the battery. In step S220, the processing circuit 221 generates the unit voltage difference value VU according to the highest voltage value VMAX and the lowest voltage value VMIN of the battery. In step S230, the processing circuit 221 controls the electronic device in the at least one operation mode to obtain the at least one time length required for the voltage value data DB to drop to the unit voltage difference value VU in the at least one operation mode. In step S240, the processing circuit 221 generates the total discharge capacity DSUM of the battery according to the at least one time length corresponding to the at least one operation mode and the use time interval of the electronic device in the at least one operation mode. In this embodiment, implementation details of steps S210 to S240 have been clearly described in steps S110 to S140 of FIGS. 1 and 2. Therefore, the same details will not be repeated in the following.

In step S250, the compensation circuit 222 generates the discharge compensation coefficient COE1 of the battery. In an embodiment, the compensation circuit 222 receives a preset discharge rate VD of the battery. The preset discharge velocity VD is the discharge rate of the battery in a specific operation mode when the battery leaves the factory. The preset discharge rate VD may be obtained by the specification of the battery. The compensation circuit 222 detects an average discharge rate VA of the battery. The compensation circuit 222 may be based on an average value of an actual discharge rate that the voltage value data DB drops over time in the specific operation mode. The compensation circuit 222 generates the discharge compensation coefficient COE1 according to the average discharge rate VA and the preset discharge rate VD.

The compensation circuit 222 may obtain the discharge compensation coefficient COE1 based on the formula (8).

$$COE1 = \frac{VA - VD}{VD} \quad \ldots \quad \text{Formula (8)}$$

The compensation circuit 222 subtracts the preset discharge rate VD from the average discharge rate VA to generate a rate difference value, and divides the rate difference value by the preset discharge rate VD to generate the discharge compensation coefficient COE1. Based on the formula (8), when the discharge compensation coefficient COE1 is larger, it indicates that the average discharge rate VA is larger. That is, the worse the state of health HE of the battery is.

In addition, in step S250, the determination circuit 223 receives the discharge compensation coefficient COE1 from the compensation circuit 222, and determines the state of health HE of the battery according to the discharge compensation coefficient COE1. Further, the determination circuit 223 determines the state of health HE of the battery by grading the discharge compensation coefficient COE1 based on Table 1. For example, the state of health HE is a state signal. The electronic device may output audio messages, text messages, or video messages corresponding to the state of health HE according to the state signal.

TABLE 1

| Discharge compensation coefficient COE1 | State of health HE |
| --- | --- |
| COE1 > 0.8 | Very poor |
| 0.8 ≥ COE1 > 0.6 | Poor |
| 0.6 ≥ COE1 > 0.4 | Ordinary |
| 0.4 ≥ COE1 > 0.2 | Good |
| COE1 ≤ 0.2 | Very good |

In an embodiment, in order to detect the average discharge rate VA, the compensation circuit 222 may be required to perform long-term statistics and sampling on the voltage value data DB. Therefore, the detection device 200 further includes a memory circuit 224. The memory circuit 224 stores a large amount of voltage value data DB required for calculating the average discharge rate VA. The memory circuit 224 may be implemented by memory elements known to those skilled in the art.

In step S260, the compensation circuit 222 generates the discharge compensation value C1 according to the discharge compensation coefficient COE1 and the total discharge capacity DSUM from the processing circuit 221. In an embodiment, the compensation circuit 222 may generate the discharge compensation value C1 based on the formula (9). In other words, the compensation circuit 222 multiplies the discharge compensation coefficient COE1 by the total discharge capacity DSUM to generate the discharge compensation value C1.

$$C1 = COE1 \times DSUM \quad \ldots \quad \text{Formula (9)}$$

In step S270, the processing circuit 221 may generate the current power capacity POUT based on the formula (10). PPRE is the previous power capacity. The processing circuit 221 subtracts the total discharge capacity DSUM and the discharge compensation value C1 from the previous power capacity before the use time interval (or referred to as a previous use time interval) to generate the current power capacity POUT.

$$POUT = PPRE - DSUM - C1 \quad \ldots \quad \text{Formula (10)}$$

It should be noted that, in general, the discharge rate of the battery increases after long-term use. Therefore, a detection mechanism is required to be compensated according to the discharge rate of the battery. The detection device 200 may dynamically compensate the current power capacity POUT according to the average discharge rate VA. In addition, the detection device 200 may further determine the state of health HE of the battery according to the average discharge rate VA.

Figure 5:
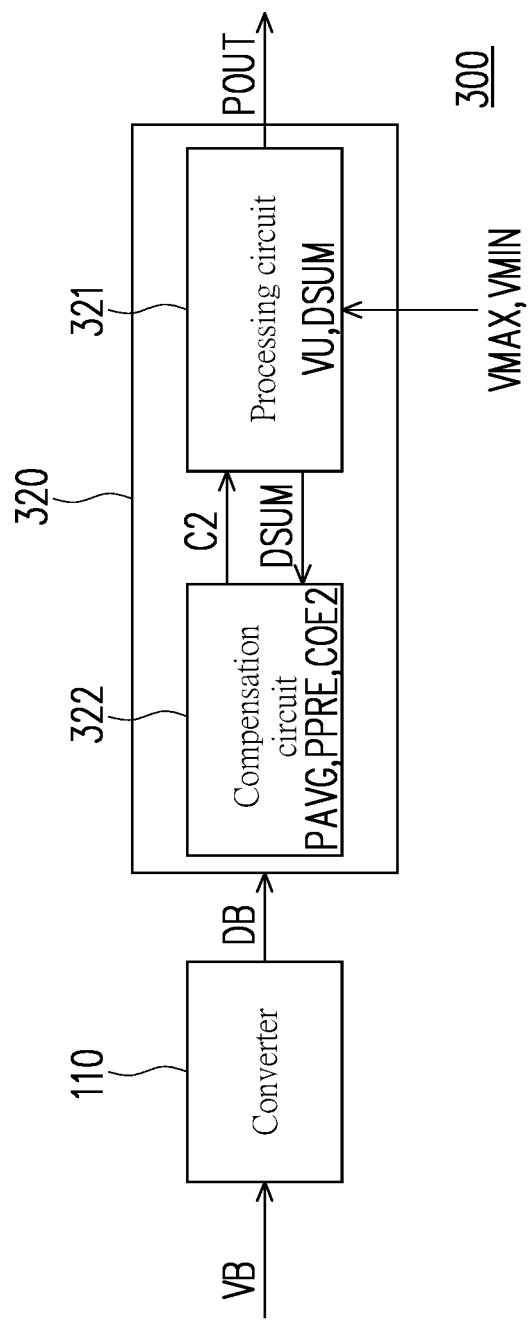
FIG. 5 is a schematic view of a detection device according to an embodiment of the disclosure.

Referring to FIG. 5, FIG. 5 is a schematic view of a detection device according to an embodiment of the disclosure. In an embodiment, a detection device 300 includes the converter 110 and a calculation circuit 320. The converter 110 converts the voltage value VB of the battery (such as the battery BTR of the electronic device ED shown in FIG. 1) into the voltage value data DB. The calculation circuit 320 includes a processing circuit 321 and a compensation circuit 222. In an embodiment, the processing circuit 321 generates the total discharge capacity DSUM. Implementation details of the processing circuit 321 generating the total discharge capacity DSUM are substantially similar to the implementation details of the calculation circuit 120 in FIG. 1 generating the total discharge capacity DSUM. Therefore, the same details will not be repeated in the following.

In an embodiment, the compensation circuit 322 is coupled to the processing circuit 321. The compensation circuit 322 generates a deviation compensation coefficient COE2 of the battery, and generates a deviation compensation value C2 according to the deviation compensation coefficient COE2. The processing circuit 321 compensates the current power capacity POUT according to the deviation compensation value C2.

Figure 6:
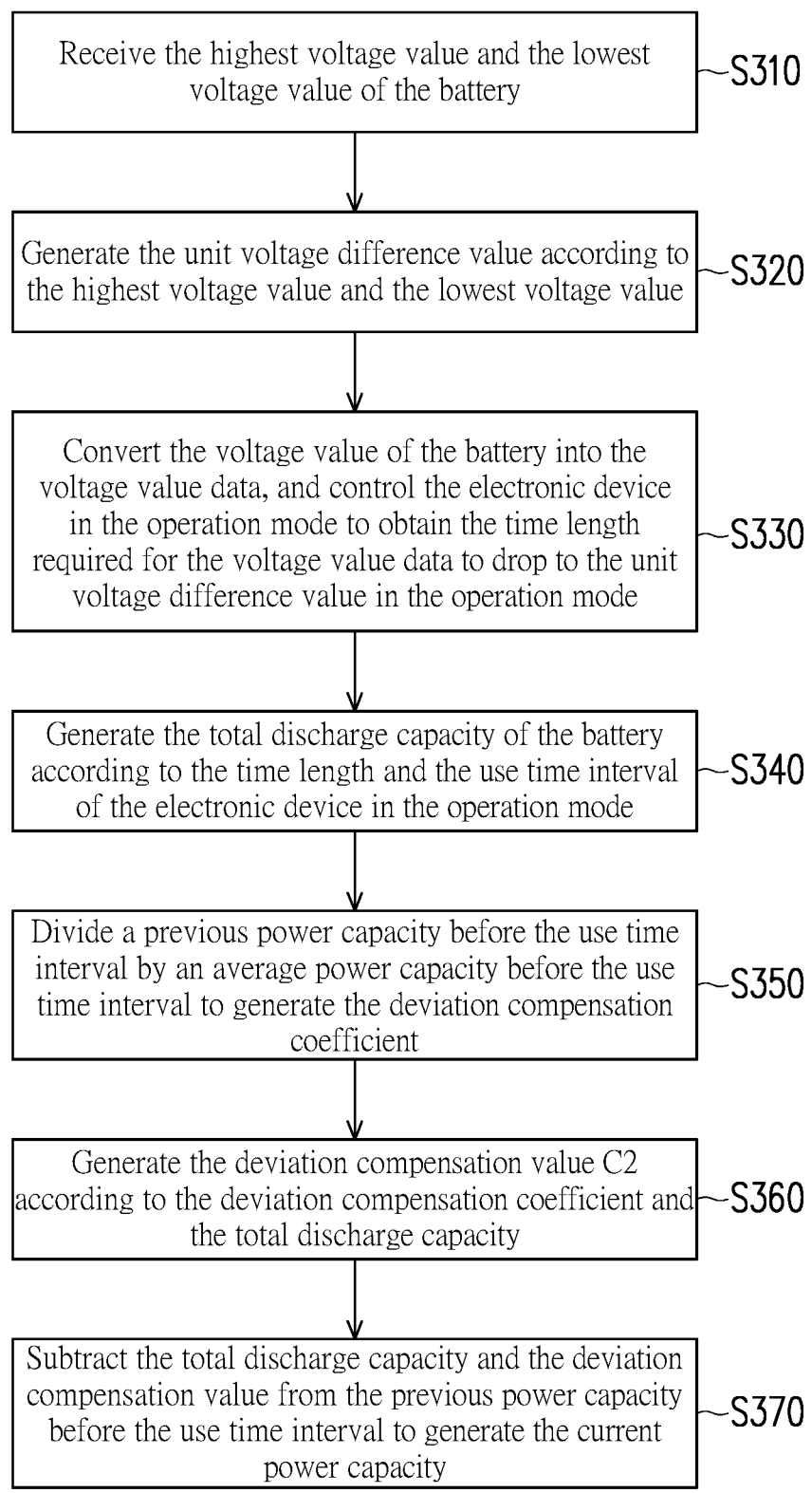
FIG. 6 is a flowchart of a calculation method according to an embodiment of the disclosure.

Referring to both FIGS. 5 and 6, FIG. 6 is a flowchart of a calculation method according to an embodiment of the disclosure. In an embodiment, a calculation method S300 is applicable to the detection device 300. The calculation method S300 includes steps S310 to S370. In step S310, the processing circuit 321 receives the highest voltage value VMAX and the lowest voltage value VMIN of the battery. In step S320, the processing circuit 321 generates the unit voltage difference value VU according to the highest voltage value VMAX and the lowest voltage value VMIN of the battery. In step S330, the processing circuit 321 controls the electronic device in the at least one operation mode to obtain the at least one time length required for the voltage value data DB to drop to the unit voltage difference value VU in the at least one operation mode. In step S340, the processing circuit 321 generates the total discharge capacity DSUM of the battery according to the at least one time length corresponding to the at least one operation mode and the use time interval of the electronic device in the at least one operation mode. In this embodiment, implementation details of steps S310 to S340 have been clearly described in steps S110 to S140 of FIGS. 1 and 2. Therefore, the same details will not be repeated in the following.

In step S350, the compensation circuit 322 may generate the deviation compensation coefficient COE2 based on the formula (11). The compensation circuit 322 divides a previous power capacity PPRE before the use time interval (or referred to as the previous use time interval) by an average power capacity PAVG before the use time interval to generate the deviation compensation coefficient COE2. The previous power capacity PPRE is a result of the power capacity calculated before the use time interval. The average power capacity PAVG is an average value of an actual power capacity measured before the use time interval. The average power capacity PAVG may be obtained by using an actual change of the voltage value data DB. In some embodiments, in step S350, the processing circuit 321 may also determine the previous power capacity PPRE and the average power capacity PAVG when the battery is in a fully charged state.

$$COE2 = \frac{PPRE}{PAVG} \text{ ...} \qquad \text{Formula (11)}$$

In step S360, the compensation circuit 322 generates the deviation compensation value C2 according to the deviation compensation coefficient COE2 and the total discharge capacity DSUM. In an embodiment, the compensation circuit 322 may generate the deviation compensation coefficient COE2 based on the formula (12).

$$C2 = (COE2 - 1) \times DSUM \text{ ...} \qquad \text{Formula (12)}$$

In step S370, the processing circuit 321 may generate the current power capacity POUT based on the formula (13). The processing circuit 321 subtracts the total discharge capacity DSUM and the deviation compensation value C2 from the previous power capacity PPRE to generate the current power capacity POUT.

$$POUT = PPRE - DSUM - C2 \text{ ...} \qquad \text{Formula (13)}$$

It should be noted that, generally speaking, fully charged voltage values (i.e., the highest voltage value VMAX) of different batteries are not exactly the same. In addition, when the battery is used for a long time, the fully charged voltage value of the battery decreases. Therefore, when the fully charged voltage value of the battery changes, the total discharge capacity DSUM generated by the processing circuit 321 deviates from an actual discharge capacity. The detection device 300 may determine whether the previous power capacity PPRE deviates based on the previous power capacity PPRE and the average power capacity PAVG.

For example, the previous power capacity PPRE is the result of the power capacity calculated before the use time interval. The average power capacity PAVG is the average value of the actual power capacity measured before the use time interval. When the previous power capacity PPRE is greater than the average power capacity PAVG, it indicates that the previous power capacity PPRE deviates higher than an actual result. The deviation compensation value C2 is greater than zero. Therefore, the current power capacity POUT is revised downward. That is, the change of the current power capacity POUT is accelerated. When the previous power capacity PPRE is less than the average power capacity PAVG, it indicates that the previous power capacity PPRE deviates lower than the actual result. Therefore, the deviation compensation value C2 is less than zero. Therefore, the current power capacity POUT is revised upward. That is, the change of the current power capacity POUT is delayed.

Furthermore, after the formulas (11) and (12) is substituted into the formula (13), the formula (13) is transformed into the formula (14).

$$POUT = PPRE - \left(\frac{PPRE}{PAVG}\right) \times DSUM \text{ ...} \qquad \text{Formula (14)}$$

In other words, the processing circuit 321 adjusts the total discharge capacity DSUM based on the previous power capacity PPRE and the average power capacity PAVG. For example, the average power capacity PAVG is 80%. The previous power capacity PPRE is 85%. The total discharge capacity DSUM has a magnification of 1.0625. The total discharge capacity DSUM is increased by 0.0625 times (i.e., 1.0625−1=0.0625), thereby correcting a result of the current power capacity POUT.

Figure 7:
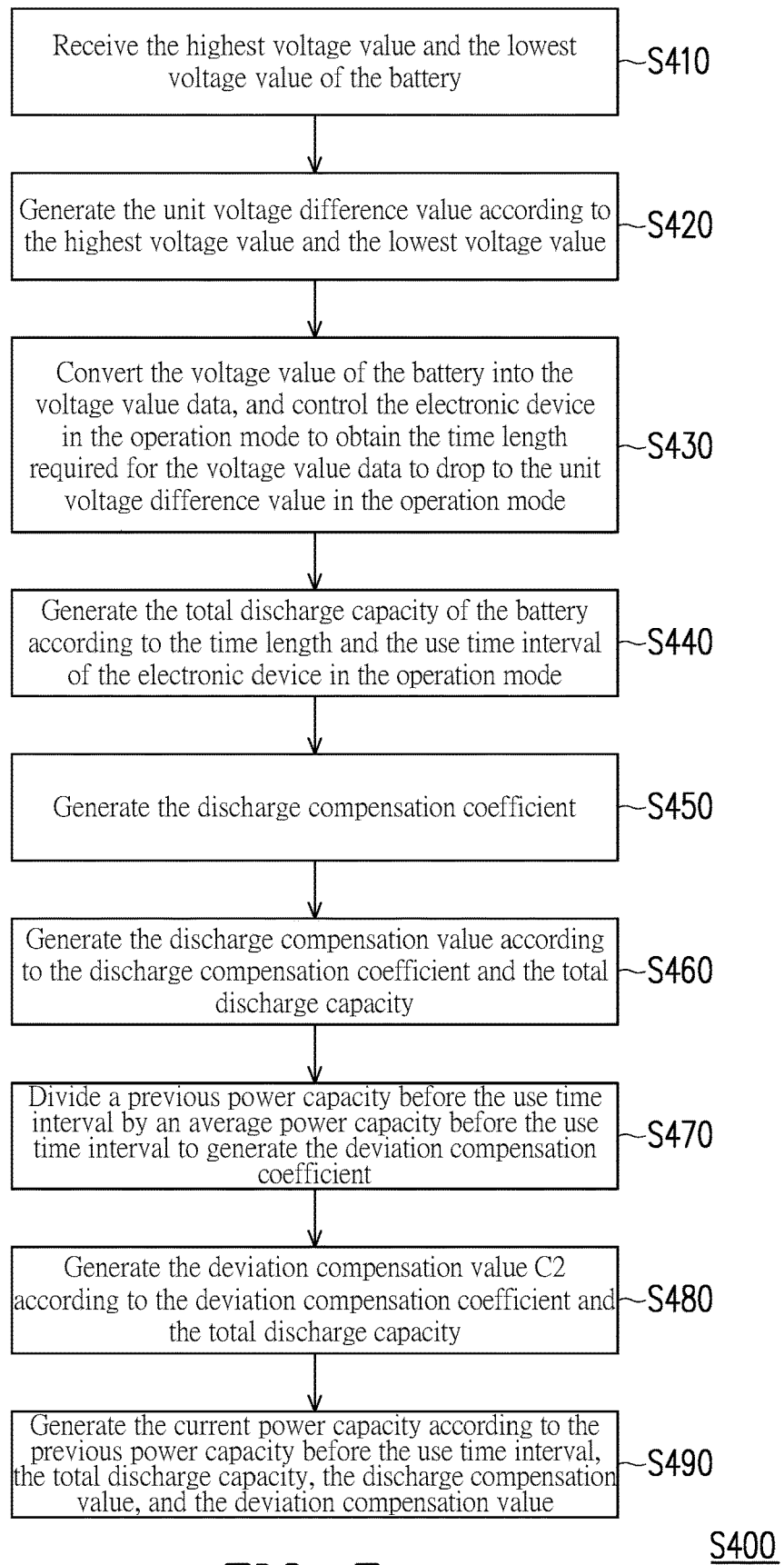
FIG. 7 is a flowchart of a calculation method according to an embodiment of the disclosure.

Referring to both FIGS. 1 and 7, FIG. 7 is a flowchart of a calculation method according to an embodiment of the disclosure. In an embodiment, a calculation method S400 is applicable to the detection device 100. The calculation method S400 includes steps S410 to S490. In this embodiment, implementations of steps S410 to S440 are similar to the implementations of steps S110 to S140. Therefore, the same details will not be repeated in the following.

In step S450, the calculation circuit 120 generates a discharge compensation coefficient (such as the discharge compensation coefficient COE1 in FIG. 3) of the battery BTR, and in step S460, generates a discharge compensation value (such as the discharge compensation value C1 in FIG. 3) based on the discharge compensation coefficient and the total discharge capacity DSUM. Sufficient teachings concerning implementation details of steps S450 and S460 may be gained from the embodiments of FIGS. 3 and 4. Therefore, the same details will not be repeated in the following.

In step S470, the calculation circuit 120 generates a deviation compensation coefficient (such as the deviation compensation coefficient COE2 in FIG. 3), and in step S480, generates a deviation compensation value (such as the deviation compensation value C2 in FIG. 3) according to the deviation compensation coefficient and the total discharge capacity DSUM. Sufficient teachings concerning implementation details of steps S470 and S480 may be gained from the embodiments of FIGS. 5 and 6. Therefore, the same details will not be repeated in the following.

In step S490, the calculation circuit 120 generates the current power capacity POUT according to the previous power capacity PPRE, the total discharge capacity DSUM, the discharge compensation value, and the deviation compensation value. The calculation circuit 120 may generate the current power capacity POUT based on the formula (15).

$$POUT = PPRE - DSUM - C1 - C2 \ldots \quad \text{Formula (15)}$$

C1 is the discharge compensation value. C2 is the deviation compensation value. That is to say, the calculation circuit 120 subtracts the total discharge capacity DSUM, the discharge compensation value, and the deviation compensation value from the previous power capacity PPRE to generate the current power capacity POUT.

Based on the above, in the calculation method and the detection device of the disclosure, the electronic device is controlled in the operation mode to obtain the time length required for the voltage value data to drop to the unit voltage difference value in the operation mode, generate the total discharge capacity of the battery according to the time length and the use time interval of the electronic device in the operation mode, and generate the current power capacity according to the total discharge capacity. It should be noted that in the calculation method and the detection device, the current power capacity is determined based on the use time interval of the electronic device in the operation mode, rather than directly based on the battery voltage of the battery to determine the current power capacity. In this way, the calculation method and the detection device of the disclosure nay eliminate the illusion of the backtracking of the power capacity. In addition, in the calculation method and the detection device of the disclosure, the current power capacity of the battery may further be compensated based on one of the discharge compensation value and the deviation compensation value, thereby improving accuracy of the current power capacity.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A calculation method for detecting a current power capacity of a battery of an electronic device, comprising:
    receiving a highest voltage value and a lowest voltage value of the battery;
    generating a unit voltage difference value according to the highest voltage value and the lowest voltage value;
    converting a plurality of voltage value of the battery into a plurality of voltage value data, sampling the plurality of voltage value data corresponding to a sampling time length;
    performing an average calculation on the plurality of voltage value data based on the sampling time length to generate a sampling average value, and controlling the electronic device in at least one operation mode to obtain at least one time length required for the sampling average value to drop to the unit voltage difference value in the at least one operation mode;
    generating a total discharge capacity of the battery according to the at least one time length and at least one use time interval of the electronic device in the at least one operation mode; and
    generating the current power capacity according to the total discharge capacity.

2. The calculation method according to claim 1, wherein the step of generating the unit voltage difference value according to the highest voltage value and the lowest voltage value comprises:
    subtracting the lowest voltage value from the highest voltage value to generate a voltage difference value; and
    dividing the voltage difference value by a preset unit value to generate the unit voltage difference value.

3. The calculation method according to claim 1, wherein the step of controlling the electronic device in the at least one operation mode to obtain the at least one time length required for the voltage value data to drop to the unit voltage difference value in the at least one operation mode comprises:
    controlling the electronic device in a first operation mode to obtain a first time length required for the voltage value data to drop to the unit voltage difference value in the first operation mode; and
    controlling the electronic device in a second operation mode to obtain a second time length required for the voltage value data to drop to the unit voltage difference value in the second operation mode.

4. The calculation method according to claim 3, wherein the step of generating the total discharge capacity of the battery according to the at least one time length and the at least one use time interval of the electronic device in the at least one operation mode comprises:
    generating a first discharge capacity of the battery according to the first time length and a first use time interval of the electronic device in the first operation mode;
    generating a second discharge capacity of the battery according to the second time length and a second use time interval of the electronic device in the second operation mode; and
    summing the first discharge capacity and the second discharge capacity to generate the total discharge capacity.

5. The calculation method according to claim 1, wherein the step of generating the current power capacity according to the total discharge capacity comprises:
    subtracting the total discharge capacity from a previous power capacity before the at least one use time interval to generate the current power capacity.

6. The calculation method according to claim 1, further comprising:
    receiving a preset discharge rate of the battery;
    detecting an average discharge rate of the battery;
    generating a discharge compensation coefficient according to the average discharge rate and the preset discharge rate; and
    generating a discharge compensation value according to the discharge compensation coefficient and the total discharge capacity.

7. The calculation method according to claim 6, further comprising:
    determining a state of health of the battery according to the discharge compensation coefficient.

8. The calculation method according to claim 6, wherein the step of generating the current power capacity according to the total discharge capacity comprises:

subtracting the total discharge capacity and subtracting the discharge compensation value from a previous power capacity before the at least one use time interval to generate the current power capacity.

9. The calculation method according to claim 1, further comprising:
dividing a previous power capacity before the at least one use time interval by an average power capacity before the at least one use time interval to generate a deviation compensation coefficient; and
generating a deviation compensation value according to the deviation compensation coefficient and the total discharge capacity.

10. The calculation method according to claim 9, wherein the step of generating the current power capacity according to the total discharge capacity comprises:
subtracting the total discharge capacity and subtracting the deviation compensation value from the previous power capacity to generate the current power capacity.

11. A detection device for detecting a current power capacity of a battery of an electronic device, comprising:
a converter coupled to the battery and configured to convert a plurality of voltage value of the battery into a plurality of voltage value data; and
a calculation circuit coupled to the converter and configured to:
receive a highest voltage value and a lowest voltage value of the battery,
generate a unit voltage difference value according to the highest voltage value and the lowest voltage value,
sample the plurality of voltage value data corresponding to a sampling time length,
perform an average calculation on the plurality of voltage value data based on the sampling time length to generate a sampling average value,
control the electronic device in at least one operation mode to obtain at least one time length required for the sampling average value to drop to the unit voltage difference value in the at least one operation mode,
generate a total discharge capacity of the battery according to the at least one time length and at least one use time interval of the electronic device in the at least one operation mode, and
generate the current power capacity according to the total discharge capacity.

12. The detection device according to claim 11, wherein the calculation circuit subtracts the lowest voltage value from the highest voltage value to generate a voltage difference value, and divides the voltage difference value by a preset unit value to generate the unit voltage difference value.

13. The detection device according to claim 11, wherein the calculation circuit subtracts the total discharge capacity from a previous power capacity before the at least one use time interval to generate the current power capacity.

14. The detection device according to claim 11, wherein the calculation circuit comprises:
a compensation circuit configured to receive a preset discharge rate of the battery, detect an average discharge rate of the battery, generate a discharge compensation coefficient according to the average discharge rate and the preset discharge rate, and generate a discharge compensation value according to the discharge compensation coefficient and the total discharge capacity.

15. The detection device according to claim 14, wherein the calculation circuit further comprises:
a determination circuit coupled to the compensation circuit and configured to determine a state of health of the battery according to the discharge compensation coefficient.

16. The detection device according to claim 14, wherein the calculation circuit further comprises:
a memory circuit configured to store the voltage value data required for calculating the average discharge rate.

17. The detection device according to claim 14, wherein the calculation circuit subtracts the total discharge capacity and subtracts the discharge compensation value from a previous power capacity before the at least one use time interval to generate the current power capacity.

18. The detection device according to claim 11, wherein the calculation circuit comprises:
a compensation circuit configured to divide a previous power capacity before the at least one use time interval by an average power capacity before the at least one use time interval to generate a deviation compensation coefficient, and generate a deviation compensation value according to the deviation compensation coefficient and the total discharge capacity.

19. The detection device according to claim 18, wherein the calculation circuit subtracts the total discharge capacity and subtracts the deviation compensation value from the previous power capacity to generate the current power capacity.

* * * * *